United States Patent [19]

Mattox et al.

[11] Patent Number: 4,960,727
[45] Date of Patent: Oct. 2, 1990

[54] METHOD FOR FORMING A DIELECTRIC FILLED TRENCH

[75] Inventors: Robert Mattox, Tempe, Ariz.; Steven Fong, Santa Clara, Calif.

[73] Assignee: Motorola, Inc., Schaumburg, Ill.

[21] Appl. No.: 274,512

[22] Filed: Nov. 18, 1988

Related U.S. Application Data

[62] Division of Ser. No. 122,086, Nov. 17, 1987, Pat. No. 4,825,277.

[51] Int. Cl.⁵ .............................................. H01L 21/76
[52] U.S. Cl. ........................................ 437/67; 937/241
[58] Field of Search .................................. 437/67, 241

[56] References Cited

U.S. PATENT DOCUMENTS

| 3,859,716 | 1/1975 | Tihanyi | 29/571 |
| 3,883,889 | 5/1975 | Hall | 357/73 |
| 4,113,515 | 9/1978 | Kooi et al. | 148/15 |
| 4,131,910 | 12/1978 | Hartman et al. | 357/49 |
| 4,148,133 | 4/1979 | Kochel et al. | 29/571 |
| 4,192,059 | 3/1980 | Khan et al. | 29/571 |
| 4,438,157 | 3/1984 | Romano-Moran | 437/238 |
| 4,454,646 | 6/1984 | Joy et al. | 29/576 |
| 4,454,647 | 6/1984 | Joy et al. | 29/576 |
| 4,471,525 | 9/1984 | Sasaki | 29/576 |
| 4,545,852 | 10/1985 | Barton | 156/643 |
| 4,571,819 | 2/1986 | Rogers et al. | 29/576 |
| 4,580,330 | 4/1986 | Pollack et al. | 29/576 |
| 4,621,414 | 11/1986 | Iranmanesh | 29/576 |
| 4,737,831 | 4/1988 | Iwai | 357/239 |
| 4,791,073 | 12/1988 | Nagy et al. | 437/67 |

FOREIGN PATENT DOCUMENTS

| 59-182538 | 10/1984 | Japan . | |
| 59-193044 | 11/1984 | Japan . | |
| 60-132341 | 7/1985 | Japan | 437/67 |

OTHER PUBLICATIONS

Wolf et al., *Silicon Processing for the VLSI Era*, vol. 1, Lattice Press, Sunset Beach, CA, p. 195.

Barton et al., "A Two Level Metal CMOS Process for VLSI Circuits", *Semiconductor International*, Jan. 1985, pp. 98-102.

Gaind et al., "Physicochemical Properties of Chemical Vapor-Deposited Silicon Oxynitride from a $SiH_4$—$CO_2$—$NH_3$—$H_2$ System" Solid State Sci & Technology, vol. 125, No. 1, Jan. 18, pp. 139-145.

Maeyama et al., "Surface Silicon Crystallinity and Anomalous Composition Profiles of Buried $SiO_2$ and $Si_3N_4$ Layers Fabricated by Oxygen and Nitrogen Implantation in Silicon" Japanese Journal of Applied Science, vol. 21, No. 5, May 1982, pp. 744-751.

Burkhardt, "Composite Silicon Dioxide-Silicon Oxynitride Insulating Layer" IBM Tech. Disc. Bulletin, vol. 13, No. 1, Jun. 1970.

*Primary Examiner*—Olik Chaudhuri
*Assistant Examiner*—Ourmazd Ojan
*Attorney, Agent, or Firm*—Joe E. Barbee; Stuart T. Langley

[57] ABSTRACT

A structure and method for forming an isolation wall in an etched trench are described. The trench walls are covered by a thin silicon oxide layer and the trench conformally filled with an oxy-nitride mixture having a particular range of composition so as to produce a neutral to slight tensile stress in the oxy-nitride relative to silicon. The structure is very simple to fabricate and creates fewer defects in the silicon substrate than prior art techniques. Buried voids in the filled trench are eliminated.

5 Claims, 3 Drawing Sheets

METHOD FOR FORMING A DIELECTRIC FILLED TRENCH

This is a division of application Ser. No. 07/122,086, filed Nov. 17, 1987, U.S. Pat. No. 4,825,277.

BACKGROUND OF THE INVENTION

This invention relates, in general, to semiconductor devices and, more particularly, to a means and method for providing an insulating isolation wall for electrically isolating one portion of an integrated semiconductor device structure or circuit from another. The isolation wall is formed in a trench provided in the semiconductor substrate.

It is commonplace to provide isolation walls between adjacent devices or device regions in integrated circuits, particularly bipolar integrated circuits. In the prior art these isolation walls have been formed of dielectric such as silicon dioxide. A disadvantage of using thermally grown silicon dioxide for the isolation walls is that oxide growth progresses laterally as well as vertically making achievement of small lateral dimensions and precise dimensional control more difficult. In addition, trapped voids are frequently formed when oxide is used, particularly in trenches whose depth is equal to or larger than their width. Trapped voids are undesirable.

Further, silicon dioxide, which is the most commonly used trench refill material, whether grown or deposited has a different coefficient of thermal expansion than most semiconductor substrates. As a consequence, when the semiconductor wafer is heated and cooled during processing, the differential thermal expansion and contraction of the isolation wall and the substrate can induce great stress in the semiconductor substrate. The high stress leads to defect formation in the semiconductor substrate adjacent the isolation wall. This is undesirable.

It is known in the prior art to replace part of the dielectric of the isolation wall with a polycrystalline semiconductor of the same material as the substrate. The poly region is isolated from the substrate by a thin oxide region on the sides of the isolation wall trench or is doped so as to form a PN junction with the single crystal semiconductor substrate material, or both. While the use of such a polycrystalline semiconductor plug can reduce the differential expansion mismatch, it creates other problems well known in the art.

While isolation walls may be successfully made using these prior art approaches, they still suffer from a number of disadvantages. For example, the processing required to produce such prior art isolation walls in complex and expensive; it is difficult to obtain a smooth level surface above the isolation wall which joins with the substrate surface without "bird's beaks", steps, or other artifacts; the trench filling materials used for the isolation wall do not all have the desired differential stress characteristics with respect to the substrate; and trapped voids frequently form within the trench refill material. Thus, there continues to be a need for improved isolation wall structures and methods for integrated circuits and devices.

Accordingly, it is an object of the present invention to provide an improved means and method for isolation walls for semiconductor devices and integrated circuits.

It is an additional object of the present invention to provide an improved means and method for isolation walls for semiconductor devices and integrated circuits formed by etch-out and refill.

It is a further object of the present invention to provide an improved means and method for isolation walls for semiconductor devices and integrated circuits employing a material of adjustable coefficient of expansion relative to the semiconductor substrate.

It is an additional object of the present invention to provide an improved means and method for isolation walls for semiconductor devices and integrated circuits having controlled stress relative to the semiconductor substrate.

It is a further object of the present invention to provide an improved means and method for isolation walls which avoids formation of enclosed voids.

It is an additional object of the present invention to provide and improved means and method for isolation walls by use of materials and deposition techniques which provide conformal deposition of a dielectric material for filling isolaton trenches.

SUMMARY OF THE INVENTION

The foregoing and other objects and advantages are provided by the method and structure of the present invention wherein a trench is formed having a sidewall and bottom extending into a semiconductor substrate, the sidewall of the trench, at least, is optionally covered with a thin silicon dioxide layer, and the remainder of the trench is filled with a silicon oxide-silicon nitride mixture having an equivalent mole fraction of silicon nitride at least in the range 0.1–0.5, more preferably in the range 0.1–0.3, with 0.1–0.2 being typical.

Formation of trapped voids at the center of the dielectric refill is avoided by using deposition techniques for the oxy-nitride which are very conformal, that is, depositing equal thickness on all substrate surfaces regardless of orientation and not creating lateral protrusions at the upper corners of the trench which occlude the trench opening. Low pressure chemical vapor deposition (LPCVD) using a source gas comprising dichloro-silane plus ammonia plus nitrous oxide gives superior results. The oxy-nitride mixture formed therefrom deposits very conformally on the trench sidewalls and bottom and fills the trench without forming a trapped void at the center of the trench where the layers depositing on the trench sidewall eventually meet.

It is convenient to over-fill the trench with the oxy-nitride mixture so that it also covers the substrate surface. A planarizing layer having an etch rate comparable to the oxy-nitride is then applied and a planarizing etch performed to remove the oxy-nitride extending above the substrate surface. This gives an isolation wall whose upper surface is substantially coplanar with the upper surface of the substrate.

If the etch back creates a crevice or seam in the center of the oxy-nitride in the trench, as is sometimes the case, this is conveniently plugged by a silicon nitride cap. The silicon nitride cap is conveniently formed by applying a silicon nitride layer generally and then etching away the silicon nitride from the substrate surface, leaving the nitride cap in the seam.

A more complete understanding of the present invention along with further advantages thereof can be attained from the following description in conjunction with the accompanying drawings.

DETAILED DESCRIPTION OF THE FIGURES

Figure 1:
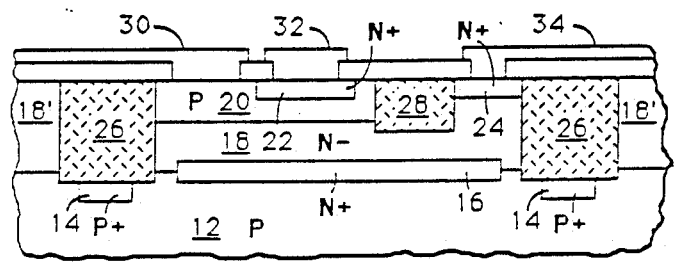
FIG. 1 shows a schematic cross-section through a portion of a semiconductor substrate containing a bipolar transistor and isolation walls.

FIG. 1 is a simplified cross-sectional view through portion 10 of a semiconductor substrate, for example silicon, containing a typical bipolar transistor isolated by isolation walls. Those of skill in the art will appreciate that the bipolar device of FIG. 1 is shown merely for purposes of explanation and that the isolation walls of the present invention are not limited mearly to usage in conjunction with bipolar transistors but are applicable to electrical isolation of all types of semiconductor elements or devices.

Exemplary bipolar transistor 10 comprises P type semiconductor substrate 12, P+ channel-stops 14, N+ buried layer 16, N− collector epi-region 18, P type base region 20, N+ emitter region 22, N+ collector contact region 24, and base, emitter, and collector contacts 30, 32, and 34. Circumferential isolation wall 26 is provided to separate device 10 from other devices or semiconductor elements (not shown) located elsewhere on substrate 12 in epi-region 18'. Isolation wall 28 separates collector contact region 24 from base region 20. This invention is concerned with the structure and fabrication of isolation walls 26, 28.

FIGS. 2A-I show simplified schematic cross-sectional views of just the isolation wall portion of the device of FIG. 1 during various stages of fabrication and according to the present invention. Isolation wall 40 corresponds to either isolation walls 26 and 28 which differ merely in depth and lateral placement. For simplicity, channel-stop region 14 and other device regions of the transistor of FIG. 1 have been omitted from FIGS. 2A-I, but those of skill in the art will understand that they may be formed before, during, or after the formation of isolation wall 40. Means and methods for forming such device regions are well known in the art.

Figure 2A:
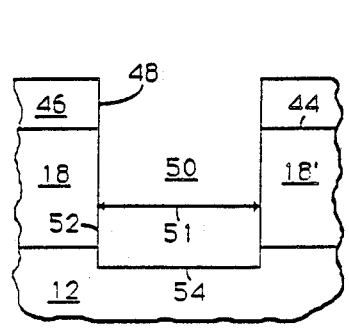
FIGS. 2A-I show simplified cross-sectional views through a portion of a semiconductor device containing an isolation wall according to the present invention, at different stages of manufacture.

As shown in FIG. 2A, semiconductor substrate 12 having principal surface 44 is covered with mask layer 46 having opening 48 corresponding to the desired location of isolation wall 40. Silicon is an example of a typical semiconductor material for substrate 12 but other semiconductor materials well known in the art can also be used. Where substrate 12 is to accommodate a bipolar transistor or MOS transistor it may optionally include epi-regions 18, 18' indicated in FIGS. 1 and 2A, but this is not essential and this detail is omitted in FIGS. 2B-I for simplicity. Mask 46 may be of any material suitable for masking semiconductor substrate 12 during formation of trench 50. Photoresist, silicon oxide, silicon nitride or sandwiches thereof are examples of suitable mask materials. Means for forming such masks are well known in the art.

Trench 50 of width 51 determined substantially by mask opening 48 is formed in substrate 12. Etching using means well known in the art is convenient for forming trench 50. Trench 50 has sidewall 52 extending from surface 44 into substrate 12 and bottom 54. Although trench 50 is shown as having a substantially rectangular cross-section, that is not essential. Typical dimensions for trench 50 are 0.5 to 1.5 micrometers in width and 0.5 to 2.0 micrometers in depth, but trenches of other sizes can be formed depending upon the device and circuit requirements. While the present structure and method is particularly useful with trenches having micron to submicron dimensions, they may be used for larger trenches as well.

Figure 2B:
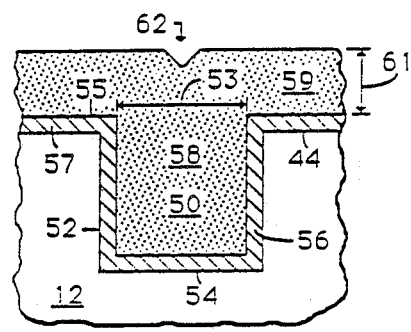

As shown in FIG. 2B, dielectric layer 56-57 is formed on sidewall 52 and bottom 54 of trench 50 and on surface 44 of substrate 12. While any means for forming dielectric layer 56-57 may be used, thermal oxidation is particularly convenient where substrate 12 is of silicon. Even with other semiconductor materials, silicon dioxide is desirable for layer 56-57, but other refractory dielectrics may also be used. Thermal oxidation of silicon is also desirable because it usually results in fewer surface defects in the semiconductor substrate and fewer trapped charges than with deposited layers. Layer 56-57 is typically about 0.02 micrometers thick but thicker and thinner layers may also be used. While a minimum thickness of about 0.01 micrometers is desirable for layer 56-57, it is not essential and layer 56-57 may be omitted.

It is important that layer 56-57 and subsequently formed layer 58-59 be conformal, that is have equal thickness on sidewalls 52, bottom 54, and upper surface 44. If, for example, layers 56-57 and/or 58-59 are thicker on surface 44 than on sidewalls 52, then inwardly directed lateral protrusions will tend to form at the upper corners of the trench, i.e., where surface 44 and sidewalls 52 joint. During filling of the trench, these lateral protrusions can become accentuated resulting in premature closure of the top of the trench prior to complete lateral filling of lower parts of the trench. This creates a buried or trapped void in the refill material. This is undesirable.

Following formation of layer 56-57, the remaining portion of trench 50 is filled with a silicon oxy-nitride mixture. Oxy-nitride layer 58-59 comprises plug portion 58 in trench 50 and surface portion 59 on surface 55 of dielectric layer 56-57.

To avoid trapped or buried voids, silicon oxy-nitride mixture 58-59 should be conformally deposited on dielectric 56-57. Low pressure chemical vapor deposition (LPCVD) using dichloro-silane plus ammonia plus nitrous oxide mixtures is an example of a suitable deposition techniques which gives conformal layers, no significant lateral protrusions, seamless (except at the upper surface) filling of the trench, and no buried voids. Other deposition methods may also be used provided that (1) they allow the relative proportion of oxide and nitride in the oxy-nitride mixture to be adjusted to predetermined values and (2) they give a conformal oxy-nitride layer without inwardly directed protrusions at the upper trench corners or trapped voids. It is also desirable that the outer surfaces of the filling material depositing or forming on the sidewalls, bond together where they meet within the trench.

Generally, thickness 61 of oxy-nitride layer 58-59 should be at least equal to half of width 53 of trench 50 between opposed sidewall portions 56 of dielectric 56-57. Width 53 is approximately equal to width 51 of trench 50 less twice the thickness of dielectric layer 56-57. Where two trenches intersect, e.g., forming a cross when viewed looking at the substrate surface, the minimum thickness of layer 58-59 should be increased to be at least half the longest lateral diagonal of the intersection.

The forgoing criteria insure that thickness 61 of layer 58-59 will be at least sufficient to provide substantial closure of trench 50 and, except for surface artifact 62, layer 58-59 will have a substantially smooth upper surface so far as the isolation wall portion of the device is concerned. With trench widths of about 1.5 micrometers, oxy-nitride layer thicknesses in the range of 1-2 micrometers give satisfactory results.

As previously noted, it is important that the process for forming oxy-nitride layer 58-59 be substantially conformal, and especially that it not deposit preferentially on the upper corners of trench 50. If the mouth of trench 50 closes before the lower part of the trench has been filled, then there will be a void within portion 58 of layer 58-59 underneath surface artifact 62. It was found for example, that formation of oxy-nitride 58-59 using silane rather than dichlorosilane as a silicon source gas for the oxy-nitride mixture did not give sufficiently conformal oxy-nitride layers. With silane, inwardly protruding cusps formed at the upper corners of the open trenches and trapped voids were obtained in the filled trenches. This is undesirable.

Figure 2C:
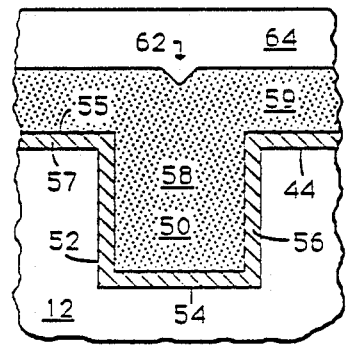
Figure 2D:
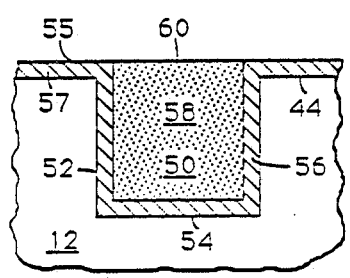

Oxy-nitride layer 58-59 is covered by planarizing layer 64 (FIG. 2c). It is desirable that planarizing layer 64 be a material that will smoothly fill artifact 62 and that etches at substantially the same rate as layer 58-59. When the combination of layers 58-59 and 64 are subjected to a planarizing etch to remove layer 64 and portion 59 of layer 58-59, the structure shown in FIG. 2D is obtained. Surface 55 of dielectric layer 56-57 and surface 60 of oxy-nitride plug portion 58 in trench 50 are now exposed and substantially co-planar. Isolation wall 40 so formed is now ready for further device processing.

Planarization etching is conveniently accomplished in a type 8110 plasma reactor manufactured by Applied Materials Corp, Santa Clara, Calif. using a mixture of $CHF_3$ and oxygen. Type AZ Photoresist manufacture by American Hoechst Corp., Sommerville, N.J. is an example of a suitable planarizing material for layer 64. Suitable planarizing etch gas mixtures for use with this material are about 30-40% oxygen with about 35-40% oxygen being preferred, measured as the percentage oxygen to total oxygen+$CHF_3$. The preferred ranges gives approximately equal etch rates for the resist and the oxy-nitride. Those of skill in the art will understand how to adjust the relative etch rates for different planarizing materials and different oxy-nitride compositions. Varying the oxygen and $CHF_3$ proportions in the plasma reactor is a typical method.

It will be appreciated by those of skill in the art that the foregoing process does not produce the "bird's beak" which is obtained with dielectric isolation walls produced by thermal oxidation of the underlying semiconductor. It will also be appreciated that the above-described process is simpler than processes required to provide isolation walls composed of sandwiches of oxide, nitride, polysilicon, and/or other materials. Further, the isolation walls produced by the present method and materials are free from undesirable trapped voids. Further, once trench 50 is etched, isolation wall 40 may be completed without need for further masking operations, although they are not precluded.

Those of skill in the art will also appreciate that the above-described process and structure is very convenient for manufacture. For example, the planarization etch need not be stopped precisely when surface 55 of oxide layer 56-57 is exposed, but may continue toward substrate surface 44, removing surface 55 of portion 57 along with surface 60 of oxy-nitride plug 58. It has been found that surface 55 of oxide portion 57 and surface 60 of oxy-nitride 58 etch at substantially similar rates. Thus, the planarization process may be stopped anywhere within the thickness of layer portion 57 without any sacrifice of planarization. This provides manufacturing latitude which is highly desirable. A two step procedure may also be used, that is, an initial plasma etching step to remove the bulk of layer portion 59, stopping short of surface 44, and then a wet etch to remove the remainder. This provides additional control.

As will be appreciated by those of skill in the art, avoiding buried voids is particularly important where a final wet etch is employed, since some of the liquid etching reagent may enter the void at a weak spot and become trapped there until after device manufacture is completed. Trapping acids such as are typically used for wet etching is very undesirable because of their adverse affect on reliability of the finished device.

Figure 2E:
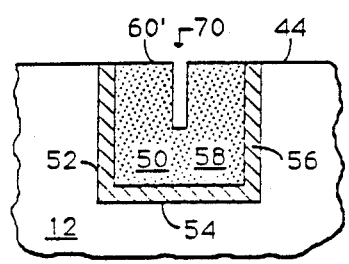

Portion 57 of dielectric layer 56-57 on substrate surface 44 may be removed if desired. Upper surface 60 of oxy-nitride plug 58 will also etch so that upper surface 60' is substantially coplanar with substrate surface 44. Wet etching in buffered HF is a preferred method for removing portion 57, since this results in less damage to underlying surface 44 of substrate 12. Wet etching in buffered HF also etches the oxy-nitride. The result is shown in FIG. 2E. The structures illustrated in either FIGS. 2D or 2E are suitable for construction of the device illustrated in FIG. 1 or other devices or elements.

As is also shown in FIG. 2E, it is sometimes the case that the etching associated with the planarization of layer 58-59 or the removal of portion 57 of layer 56-57, causes the formation of crevice or seam 70 in oxy-nitride plug 58 after etching where none existed before. This crevice or seam is different that the buried voids discussed earlier. No seam or crevice is visible in the oxy-nitride layer within the trench if the device is sectioned before etching.

Crevice or seam 70 forms where the inward growing faces of portion 58 of layer 58-59 forming in trench 50 meet and grow together. It has been found that this interface is more sensitive to etching than is the remainder of the layer 58-59 and will often etch at an accelerated rate compared to the rest of layer 58-59 resulting in the formation of seam 70. It is desirable to seal or cap seam 70 to obtain a planar surface and also to protect this region of isolation wall 40 from further etching during subsequent stages of fabrication. This is accomplished by the process illustrated in FIGS. 2F-2I.

The sequence of FIGS. 2F-I may begin either from the stage of FIG. 2D (with a crevice) or from the stage of FIG. 2E. If surface 44 of substrate 12 has been exposed by prior processing, as in FIG. 2E, then it is desirably covered by a thin layer of oxide, as for example, by thermal oxidation to about the same thickness as previously used for layer 56-57. This re-creates dielectric layer portion 57'. When thermal oxidation is used, a small amount of semiconductor at surface 44 is consumed, resulting in slightly recessed surface 44' (see FIG. 2F). Surface 60' of oxy-nitride plug 58 is also exposed and may become slightly oxidized during the same process, but this is inconsequential.

Figure 2F:
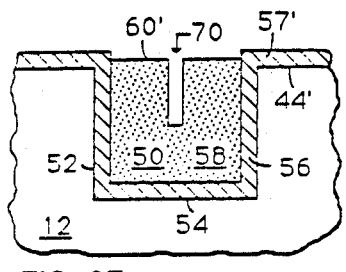
Figure 2G:
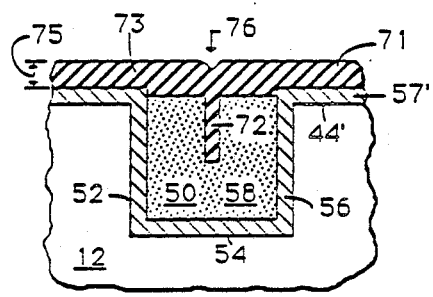

The structure of FIG. 2F is then covered by silicon nitride layer 71 having portion 72 in seam 70 and portion 73 on the upper surfaces of layer 57' and oxy-nitride plug 58 (see FIG. 2G). In general, thickness 75 should be at least half the width of the widest part of seam 70. For seam widths approximately in the range 0.05 to 0.2 micrometers, thickness 75 of layer 71-73 is usefully in the range 0.03 to 0.2 micrometers with 0.05 to 0.15 being convenient and about 0.1 being preferred. Artifact 76 reflects the presence of underlying etch seam 70.

Figure 2H:
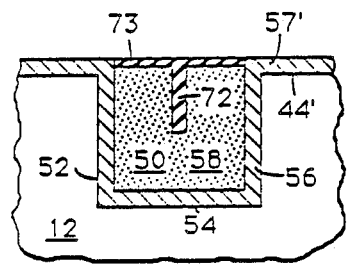

Using substantially the same planarization techniques as used for planarizing the oxy-nitride layer, nitride layer 71-73 is etched or eroded back to provide the structure shown in FIG. 2H. Those of skill in the art will understand that some adjustment of the etch gas mixture may be necessary to accommodate the differences in materials.

Figure 2I:
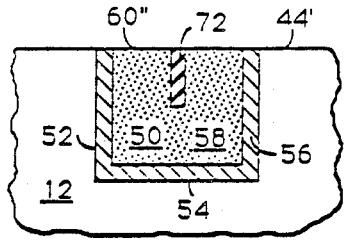

Further etching leads to the structure of FIG. 2I where surface 60'' of oxy-nitride plug 58 is substantially coplanar with surface 44' of substrate 12. Either structure (FIGS. 2H or 2I) may conveniently be used as a starting point for further device processing to complete the remainder of the transistor or other semiconductor element desired to be formed. Plasma etching and ion milling are examples of etching techniques which are suitable for the steps illustrated in FIGS. 2G-2I. Such techniques are well known in the art. As before, wet etching is preferred for removal of the last part of the layers before encountering surface 44'.

Figure 3:
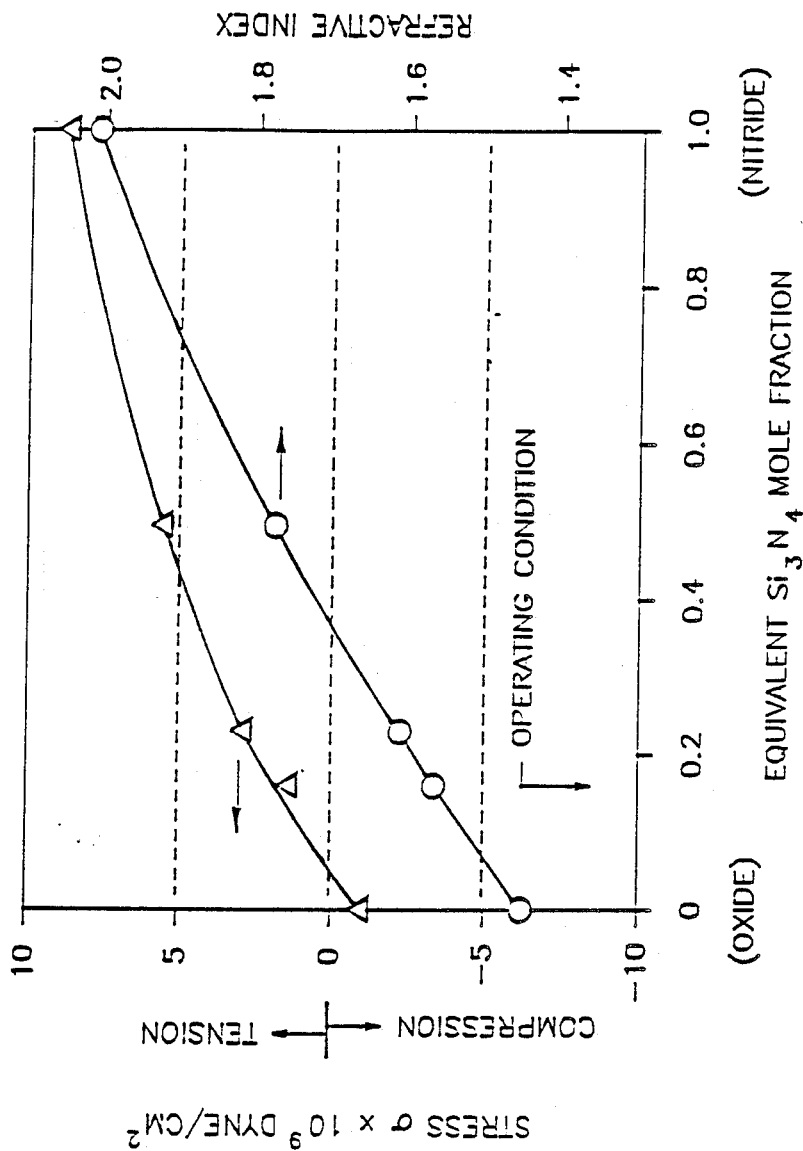
FIG. 3 is a plot of stress relative to silicon in dynes/cm$^2$ and refractive index of the oxy-nitride mixture of the present invention as a function of the equivalent mole fraction of $Si_3N_4$ in the oxy-nitride mixture.

It has been determined that the stress and the number of defects associated with isolation walls constructed according to the present invention can be reduced compared to the prior art by attention to the relative proportion of oxide and nitride in the oxy-nitride mixture used as plug 58 for filling trench 50. The relationship between stress, refractive index, and composition is illustrated in FIG. 3. FIG. 3 shows the stress in dynes/cm$^2$ and refractive indext of the oxy-nitride mixture as a function of the equivalent nitride content, measured as equivalent moles of Si$_3$N$_4$, according to the relationship:

Oxy-nitride Mix=X (SiO$_2$)+Y (Si$_3$N$_4$), in moles, and were X+Y=1. The abscissa of FIG.3 corresponds to the factor Y in the above equations.

It has been found that it is desirable that the oxy-nitride mixture used for plug 58 exhibit a stress relative to silicon in the range $-1$ to $+5\times 10^9$ dynes/cm$^2$, better $-1$ to $+3\times 10^9$ dynes/cm$^2$, with the narrower range of $-1$ to $+2\times 10^9$ dynes/cm$^2$ being convenient, and about $+1\times 10^9$ dynes/cm$^2$ being preferred. For stress values greater than zero, the oxy-nitride is in tension relative to the silicon.

As a function of composition, it is desirable to operate with an equivalent mole fraction of nitride in the range of 0.1-0.5 nitride, better 0.1-0.4, and still better 0.1-0.3, with the range 0.1-0.2 being preferred. It was found that about 0.15 equivalent mole fraction of nitride is convenient for the oxy-nitride mixture. The refractive index was found to vary from about 1.5 to about 1.8 as the composition was varied from about 0.1 to about 0.5 equivalent mole fraction of nitride.

EXAMPLE

While the oxy-nitride mixture may be formed by any convenient techniques which provides control of the relative oxy-nitride composition, good conformality (i.e. no lateral protrusions occluding the mouth of the trench), and seam-free layer joining within the trench, LPCVD using dichloro-silane, ammonia and nitrous oxide was found to be a convenient method. LPCVD is well known in the art. Oxy-nitride layers having a thickness in the range 0.3 to 2.0 micrometers were fabricated with about 1.4 micrometers being typical. Control samples were prepared for measurement of the stress relative to silicon and the refractive index.

The oxy-nitride layers were typically deposited in a conventional LPCVD reactor at 400 millitorr pressure and 900° C. using SiH$_2$Cl$_2$ with NH$_3$ and N$_2$O to form the nitride and oxide components of the mixture. The SiH$_2$Cl$_2$ flow and total flow were held constant at 15 and 165 SCCM respectively, and the NH$_3$/N$_2$O ratio was varied to achieve the desired oxide-nitride mixture.

Oxy-nitride layers formed as described above deposit conformally on the facing sidewalls of the trench and grow together in the center of the trench without voids or a visible seam within the trench. Only the presence of surface artifact 62 shows where joining has occurred. This is in contrast to trenches filled with oxide either by thermal oxidation or deposition where a demarcation line can be seen in cross-sectioned devices beneath the surface artifact where the oxide layers met. However, even though there is no visible seam in the oxy-nitride in the trench, it does etch more rapidly under surface artifact 62.

Oxy-nitride layers formed using SiH$_4$ in place of the SiH$_2$Cl$_2$ did not give as good results. With the SiH$_4$ instead of the SiH$_2$Cl$_2$, deposition was less conformal and lateral protrusions formed at the upper corners of the trench. Thus, the mouth of the trench closed prematurely and trapped voids were formed beneath the surface in the trench.

As will be appreciated by those of skill in the art based on the description herein, the amount of stress relative to silicon may be adjusted by varying the oxy-nitride mixture composition. This may be done in a more precise way than by use of layered structures as have been used in the past. Further, different portions of the mixture may be tailored to have different compositions and therefore different stresses, smoothly varying therebetween. This cannot be accomplished with prior art arrangements. Further, by using very conformal layers, trapped voids may be eliminated.

It is desirable that the target range for the oxy-nitride mixture, when measured at room temperature, be centered around a slightly positive, i.e., tensile stress relative to the substrate. This may be understood from the following explanation.

If the stress in the oxy-nitride is compressive then the surrounding semiconductor is in tension, and if the stress in the oxy-nitride is tensile, the surrounding semiconductor is in compression. Defects are more likely to form in the semiconductor when it is in tension. While ideally, it would be preferable to have a matched coefficient of expansion and zero differential stress, this is very difficult if not impossible to achieve in practice over a sufficiently wide temperature range. Coefficients of thermal expansion are, in general, temperature dependent. While the coefficients of expansion may be matched at one temperature, they will likely be different at another temperature. Where, as here, the semiconductor substrates must withstand wide temperature excursions during manufacturing, it is not possible to achieve perfect expansion match over all temperatures. Further, it is desirable to have a structure and process which accommodates some variation in the properties of the oxy-nitride plug due to manufacturing variations.

Accordingly, it has been found that it is more desirable to operate in a composition range slightly biased toward tensile stress in the oxy-nitride so as to insure that there is little or no compressive stress in the nitride (and tensile stress in the semiconductor) and limited tensile stress in the nitride (and compressive stress in the semiconductor) over the expected temperature range. Thus, the compositional ranges which accomplish this are preferred. That the proper composition has been obtained may be conveniently determined from the refractive index.

Having thus described the invention, it will be apparent to those of skill in the art that various modifications can be made within the spirit and scope of the present invention. For example, trench 50 shown in FIGS. 2A-I and seam 70 shown in FIGS. 2E-I are simplified as compared to the actual shape of the trench and seam which may be encountered in practice. Those of skill in the art will understand that both trench 50 and seam 70 may have sides which slope (typically slightly outwardly toward the trench opening), may have rounded upper corners where the sidewall of the trench or seam joins the upper surface and may have rounded corners where the sidewall joins the bottom of the trench or seam. The above-described invention applies equally well to these variations.

Further, while silicon oxy-nitride mixtures have been particularly illustrated, other dielectrics which exhibit an adjustable predetermined value of stress relative to the semiconductor substrate, conformal and void free deposition, and good internal closure (no built-in, as formed seam) could also be used. In addition, the structure and method may be applied to other substrates besides silicon, including composite substrates and substrates of other semiconductor materials by making suitable adjustments in the proportions so as to achieve a differential stress in the indicated range. These and other variations such as will occur to those of skill in the art based on the teachings herein are intended to be included within the claims which follow.

We claim:

1. A method for forming an isolation wall in a semiconductor device, comprising:
   providing a semiconductor substrate having a surface;
   forming a trench having a sidewall and a bottom extending into said substrate from said surface;
   conformally filling said trench with a silicon oxy-nitride;
   covering said silicon oxy-nitride in said trench with a silicon nitride layer; and
   etching a central seam extending into said oxy-nitride in said trench and then filling said seam and completely covering the upper surface of said oxy-nitride in said trench with silicon nitride.

2. A method for forming an isolation wall in a semiconductor device, comprising:
   providing a semiconductor substrate having a surface;
   forming a trench having a side wall and a bottom extending into said substrate from said surface;
   forming a silicon oxide layer in said trench by thermally oxidizing said surface, said sidewall, and said bottom;
   conformally filling said trench with a silicon oxy-nitride, wherein said filling step comprises filling said trench and covering part of said silicon oxide layer with said oxy-nitride;
   covering said silicon oxy-nitride in said trench with the silicon nitride layer;
   covering said oxy-nitride with a planarizing material and etching said planarizing material and said oxy-nitride substantially back to said surface, wherein said step of etching said planarizing material and said oxy-nitride from said surface comprises removing silicon oxide from said surface and thereafter reforming silicon oxide on said surface;
   forming a silicon cap layer on said reformed silicon oxide and said oxy-nitride, wherein an open crevice is etched centrally in said oxy-nitride and wherein said step of forming said cap layer comprises forming said cap layer in said open crevice.

3. The method of claim 2 further comprising removing said cap layer and said reformed silicon oxide from above said surface.

4. A method for forming a dielectric filled trench in a substrate, comprising:
   providing a substrate having a principal surface;
   etching a trench in the substrate where the trench has a bottom displaced from the surface and a sidewall extending therebetween;
   filling the trench by conformally depositing a silicon oxy-nitride on the surface, the sidewalls and the bottom of the trench;
   removing the silicon oxy-nitride from above the surface leaving the silicon oxy-nitride in the trench;
   applying a silicon nitride layer above the surface and on the silicon oxy-nitride in the trench;
   removing at least part of the silicon nitride layer above the surface leaving at least part of the silicon nitride layer completely covering the silicon oxy-nitride in the trench.

5. The method of claim 4 further comprising, prior to the applying step, exposing the silicon oxy-nitride in the trench to a silicon oxy-nitride etchant.

* * * * *